United States Patent [19]

Araki et al.

[11] 4,153,525
[45] May 8, 1979

[54] PROCESS FOR CURING IONIZING RADIATION-HIGHLY SENSITIVE RESIN COMPOSITION

[75] Inventors: Kunio Araki; Takashi Sasaki, both of Takasaki; Kiyoshi Tabei, Fujisawa; Kazuo Goto, Takasaki, all of Japan

[73] Assignees: Nitto Boseki Co., Ltd.,, Fukushima; Japan Atomic Energy Research Institute, Tokyo, both of Japan; part interest to each

[21] Appl. No.: 705,921

[22] Filed: Jul. 16, 1976

Related U.S. Application Data

[63] Continuation-in-part of Ser. No. 579,059, May 20, 1975, abandoned.

[51] Int. Cl.$^2$ ............... C08F 2/54; C08L 67/06
[52] U.S. Cl. ............... 204/159.15; 204/159.19; 260/864; 428/482
[58] Field of Search ............... 204/159.15, 159.19; 260/864

[56] References Cited

U.S. PATENT DOCUMENTS

| | | | |
|---|---|---|---|
| 3,754,054 | 8/1973 | Kimura et al. | 204/159.19 X |
| 3,856,644 | 12/1974 | Traenckner et al. | 204/159.15 |
| 3,864,133 | 2/1975 | Hisamatsu et al. | 204/159.19 X |
| 3,879,318 | 4/1975 | Forsyth | 260/864 X |
| 3,926,755 | 12/1975 | Marans | 204/159.15 |

*Primary Examiner*—Walter C. Danison
*Attorney, Agent, or Firm*—Frishauf, Holtz, Goodman & Woodward

[57] ABSTRACT

A process for curing a radiation curable composition consisting essentially of (a) an amide represented by the formula

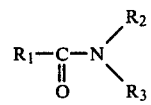

wherein $R_1$, $R_2$ and $R_3$ are defined hereinbelow, and (b) an unsaturated polyester resin by irradiating the composition with an ionizing radiation.

10 Claims, No Drawings

PROCESS FOR CURING IONIZING RADIATION-HIGHLY SENSITIVE RESIN COMPOSITION

CROSS REFERENCE TO RELATED APPLICATION:

This application is a continuation-in-part of copending application Ser. No. 579,059 filed on May 20, 1975, which has been abandoned.

This invention relates to a process for curing an unsaturated polyester resin composition. More particularly, this invention relates to a process for curing a radiation curable composition by a low total dose of an ionizing radiation, in which the composition is a mixture of (a) 0.1–10 parts by weight of an amide represented by the formula

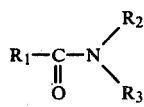

wherein $R_1$ is H, an alkyl group having 1–17 carbon atoms or alkenyl group having 1–17 carbon atoms and each of $R_2$ and $R_3$ is independently —H, —CH$_3$ or —CH$_2$OH, and $R_1$ and $R_2$ taken together represent an alkylene group having 2–5 carbon atoms, and (b) 100 parts by weight of an unsaturated polyester resin.

An unsaturated polyester resin has been cured by adding a polymerization catalyst, such as, for example, benzoyl peroxide, methyl ethyl ketone peroxide, or cyclohexanone peroxide and an accelerator, such as, for example, cobalt naphthenate or dimethyl aniline to the resin, followed by heating the mixture. Pot-life of the cured product obtained by curing the unsaturated polyester resin containing such catalyst and accelerator is short. Further, when the curing reaction of the unsaturated polyester resin containing such catalyst and accelerator starts, the reaction cannot be stopped on the way. Also, it takes a long time to complete the reaction.

In general, it was known that an unsaturated polyester resin is a radical polymerizable resin, and that when the resin is irradiated with an ionizing radiation, a radical is formed therein without using any radical initiator, whereby radical propagation occurs to cure the resin. Such resin has been widely used as a coating resin for producing decorative wood, plaster and metal plates, as an insulating varnish-based resin for electric wire or as a resin for fiber reinforced plastic plate through a curing process by using a radical initiator.

The process of curing the resin by using an ionizing radiation has the following advantages in comparison with the method of curing by using a radical initiator:

(a) Pot-life of the cured product obtained by curing the polyester resin by means of an ionizing radiation is longer and, also, the curing reaction of the polyester resin can be stopped at any stage of the reaction.

(b) It is unnecessary to heat the resin to the decomposition temperature of the initiator.

(c) It is unnecessary to use an amine compound, metal soap or an acyloin compound for promoting the decomposition of the initiator. When an amine compound, etc. is added to the resin composition, it contaminates the resulting product.

(d) The resin can be completely cured instantaneously only by means of an ionizing radiation.

However, an apparatus or source for emitting an ionizing radiation is costly and incidental facilities, such as a shielding means for avoiding the leakage of radiation, are also costly. Therefore, it is necessary to use a resin which is curable with a low total dose of radiation. In addition, it is preferable that the resin be one which can be radiation-cured without impairing the physical properties of the resin.

We have found that when an unsaturated polyester resin is mixed with an amide compound represented by the formula

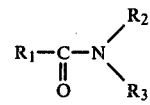

wherein $R_1$, $R_2$ and $R_3$ are as defined above, the radiation-curability of the unsaturated polyester resin is promoted. We have also found that by adding the amide compound mentioned above to the polyester resin the curing reaction of the unsaturated polyester resin can be remarkably promoted without impairing stability of the uncured polyester resin. The present invention is based on these discoveries.

Therefore, an object of this invention is to provide a process for curing an unsaturated polyester resin composition by irradiation with a low total dose of ionizing radiation.

Other objects of this invention will be clearly understood by the following description.

This invention is carried out as follows:

An unsaturated polyester resin is mixed thoroughly with an amide represented by the formula

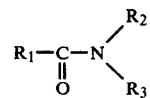

wherein $R_1$ is H, an alkyl group having 1–17 carbon atoms or alkenyl group having 1–17 carbon atoms and each of $R_2$ and $R_3$ is independently —H, —CH$_3$ or —CH$_2$OH, and $R_1$ and $R_2$ taken together represent an alkylene group having 2–5 carbon atoms, in a proportion of from 0.1 to 10 parts by weight, preferably 0.5 to 5 parts by weight based on 100 parts by weight of the polyester and, then, the mixture is irradiated with an ionizing radiation to obtain a cured polyester resin.

The amount of amide compound added to the polyester resin is in the range of 0.1–10 parts by weight, preferably 0.5–5 parts by weight per 100 parts by weight of the polyester resin. In case of adding more than 10 parts by weight of the amide compound not having any active group to 100 parts by weight of the polyester resin, though the amide compound promotes the radiation-curability of the uncured resin, it impairs physical properties and resistance to water of the cured polyester composition.

The ionizing radiation to be employed in this invention includes $\alpha$ rays, $\beta$ rays, $\gamma$ rays, X rays, electron beam, neutron beam, deuteron beam and a mixture thereof. Generally, the preferred radiation is an electron beam or $\gamma$ rays.

Generally, a dose rate of ionizing radiation of $10^3$–$10^7$ rad/sec is employed and a total dose of ionizing radiation of less than 10 Mrad, or even less than 5 Mrad is employed in the present invention. However, a total dose less than 0.5 Mrad is insufficient to cure the polyester resin composition. Since an object of the present invention is to provide a process for curing a resin with a low total dose of ionizing radiation, it will be understood that the upper limit of the dose rate and the total dose cannot be specified. Therefore, it will also be understood that the unsaturated polyester resin composition of the present invention can be cured with a total dose of radiation above 10 Mrad.

By unsaturated polyester resin we mean a composition obtained by dissolving an unsaturated alkyd in at least one ethylenically unsaturated monomer, such as, for example, styrene, vinyl acetate, vinyltoluene, chlorostyrene, divinylbenzene, acrylic acid, methacrylic acid, an acrylate, a methacrylate, acrylonitrile, methacrylonitrile, diallyl phthalate, triallyl cyanurate, trimethylolpropane trimethacrylate, ethylene glycol dimethacrylate or the like, or mixture thereof. The unsaturated alkyd which can be advantageously employed in the practice of this invention includes a reaction product of (a) at least one $\alpha,\beta$-ethylenically unsaturated polybasic acid such as, for example, maleic acid, maleic anhydride, fumaric acid, itaconic acid, itaconic anhydride, carbic acid, mesaconic acid, citraconic acid, HET acid (hexachloro-endomethylenetetrahydro phthalic anhydride), Himic anhydride (3,6-endomethylene-$\Delta^4$-tetrahydrocis-phthalic anhydride), trimellitic acid or the like, or mixture thereof and (b) optionally a saturated polybasic acid, such as, for example, succinic acid, glutaric acid, adipic acid, phthalic acid, phthalic anhydride, isophthalic acid, terephthalic acid, trimellitic acid, tetrahydro phthalic acid or the like or a saturated monobasic acid selected from benzoic acid and acetic acid, and (c) at least one polyvalent alcohol, such as, for example, ethylene glycol, propylene glycol, diethylene glycol, dipropylene glycol, triethylene glycol, butanediol-1,3-neopentyl glycol, bis-phenol A, glycerine, trimethylol propane, pentaerythritol and the like, or mixture thereof. In the present invention, $\alpha,\beta$-ethylenically unsaturated polybasic acids and polyvalent alcohols other than those described above may be used.

It is preferred to employ the unsaturated alkyd and the ethylenically unsaturated monomer in approximately the same amounts. When an excess amount of the monomer is employed, the curability of the resin is impaired. When an excess amount of the unsaturated alkyd is employed, the resin is not completely cured. However, the ratio of the unsaturated alkyd to the ethylenically unsaturated monomer is not critical in the present invention.

In the present invention, ethylenically unsaturated monomers other than those described above may be used, provided that the monomers polymerizes with the double bond in the unsaturated alkyd. In other words, since the reaction of the unsaturated alkyd with the ethylenically unsaturated monomer was publicly known, any of the known ethylenically unsaturated monomers which react with the unsaturated alkyd may be used.

The term "alkyl" as used herein and in the appended claims designates a straight- or branched-chain radical, such as, for example, methyl, ethyl, propyl, isopropyl, butyl, tert-butyl pentyl, hexyl, heptyl, octyl, nonyl, decyl, tetradecyl, pentadecyl, hexadecyl, heptadecyl, octadecyl, or nonadecyl, including the various homologues and isomers. The term "alkenyl" designates a straight- or branched-chain hydrocarbon having a double bond having $—C_nH_{2n}—1$, such as, for example, vinyl, allyl, $C_4H_7—$, $C_5H_9—$ or $C_6H_{11}—$, including the various homologues and isomers.

The amide compounds of the present invention are known or commercially available. The preferred compounds are those corresponding to the formula

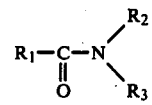

wherein $R_1$ is H, vinyl or methyl and $R_2$ is H and $R_3$ is H, methylol or $C_1-C_6$ alkyl.

Representative examples of the amide compounds corresponding to the formula include formamide, acetamide, propionic acid amide, acryl amide, valeric acid amide, capronamide, oleic acid amide, N-methylol formamide, N-methylol acetamide, N-methylol propionic acid amide, N-methylol acryl amide, N-methylol valeric acid amide, N-methylol capronamide, N-methylol oleic acid amide, N,N-dimethylol formamide, N,N-dimethylol acetamide, N,N-dimethylol propionic acid amide, N,N-dimethylol acryl amide, N,N-dimethylol valeric acid amide, N,N-dimethylol captonamide, N,N-dimethylol oleic acid amide, N-methyl formamide, N-methyl acetamide, N-methyl propionic acid amide, N-methyl acryl amide, N-methyl valeric acid amide, N-methyl capronamide, N-methyl oleic acid amide, N,N-dimethyl formamide, N,N-dimethyl acetamide, N,N-dimethyl propionic acid amide, N,N-dimethyl acryl amide, N,N-dimethyl valeric acid amide, N,N-dimethyl capronamide, N,N-dimethyl oleic acid amide, caprolactam, N,N-dimethyl formamide, N-methylol acetamide, N-methylol formamide, N,N-dimethyl acetamide.

In general, the preferred amide compounds are those having molecular weights below 300.

This invention is further illustrated, but in no way limited, by the following Examples. Parts and percentages are by weight unless otherwise indicated.

EXAMPLE 1

Maleic anhydride, phthalic anhydride and propylene glycol were mixed in the ratio of 0.6:0.4:1.1. The resulting mixture was heat-condensed and esterified, until the acid value of the mixture reached 44. 30 Parts of styrene containing 0.02 parts of hydroquinone was added to 70 parts of the resulting unsaturated alkyd and was uniformly dissolved therein to prepare unsaturated polyester resin (A).

0.5 Gr, 1 gr, 2 gr and 5 gr each of N-methylol acrylamide was added to 4 samples of 100 gr of the resulting polyester resin to prepare test samples $A_1-A_4$, respectively. Each of the test samples and the unsaturated polyester resin not containing the amide compound was distributed among several aluminum cups so as to form a composition 2 mm thick. The surface of each one of the composition so formed was covered with a polyester film having a thickness of 12.5 $\mu$. Each covered composition was irradiated with an accelerated electron beam (2 mA, $2 \times 10$ rad/sec) from an electron beam accelerator at a MeV at various total doses of radiation. The gel percent of each one of the cured resins was determined by the following method to acquire the lowest total dose for curing the resin. The method comprises extracting the cured resin with acetone for 16 hours while refluxing by Soxhlet extractor, and weighing the residue. The gel percent of cured resin represents the degree of curing of the resin. The results are given in Table 1.

Table 1

| Experiment No. | Amount of N-methylol acrylamide added (Gr) | Gel percent of the cured product after irradiating test sample with the following total dose of radiation (%) | | | Lowest total dose of ionizing radiation necessary to cure the resin (Mrad) |
| --- | --- | --- | --- | --- | --- |
| | | Mrad | 4 Mrad | 6 Mrad | |
| Control | 0 | 46 | 71 | 94 | 7.5 |
| A-1 | 0.5 | 47 | 75 | 93 | 7.0 |
| A-2 | 1 | 49 | 76 | 96 | 6.6 |
| A-3 | 2 | 48 | 81 | 100 | 5.9 |
| A-4 | 5 | 51 | 87 | 100 | 5.0 |

The lowest total dose means the minimum dose of radiation necessary to cure the resin to an extent of saturated value of gelled component in the cured product.

As shown in Table 1, the lowest total dose of ionizing radiation necessary to cure the polyester resin containing the amide compound, namely N-methylol acrylamide is lower than the lowest total dose of ionizing radiation necessary to cure the polyester resin not containing the amide compound. Furthermore, gel percent of the cured product obtained by curing the former is higher than the gel percent of the cured product obtained by curing the latter.

EXAMPLE 2

The procedure of Example 1 was repeated except that 1.0 gr and 5.0 gr of acrylamide each was added to 2 samples of the unsaturated polyester resin sold by Hitachi Chemical Co. under the trade name of "PS-51". The results are given in Table 2.

Table 2

| Experiment No. | Amounts of acrylamide added (Gr) | Gel percent of the cured product after irradiating test samples with the following total dose of radiation (%) | | | Lowest total dose of ionizing radiation necessary to cure the resin (Mrad) |
| --- | --- | --- | --- | --- | --- |
| | | 2 Mrad | 4 Mrad | 6 Mrad | |
| Control | 0 | 51 | 71 | 86 | 8.6 |
| B-1 | 1 | 54 | 78 | 92 | 7.5 |
| B-2 | 5 | 54 | 79 | 92 | 7.5 |

As shown in Table 2, addition of the amide compound, namely acrylamide to the unsaturated polyester resin not only reduces the minimum dose of radiation necessary to cure the resin, but also increase the gel percent of the cured product obtained by curing the resin.

EXAMPLE 3

The procedure of Example 1 was repeated except that 0.5 gr, 1.0 gr and 5.0 gr each of acetamide was added to 3 samples of the unsaturated polyester resin sold by Dai-Nippon Ink Co. under the trade name of "8010". The results are given in Table 3.

Table 3

| Experiment No. | Amount of Acetamide added (Gr) | Gel percent of the cured product after irradiating test samples with the following total dose of radiation (%) | | | Lowest total dose of ionizing radiation necessary to cure the resin |
| --- | --- | --- | --- | --- | --- |
| | | 2 Mrad | 4 Mrad | 6 Mrad | |
| Control | 0 | 40 | 73 | 87 | 8.0 |
| C-1 | 0.5 | 45 | 79 | 92 | 6.8 |
| C-2 | 1.0 | 46 | 79 | 93 | 6.5 |
| C-3 | 5.0 | 51 | 81 | 92 | 5.7 |

As shown in Table 3, addition of the amide compound, namely acetamide, to the unsaturated polyester resin not only reduces the minimum dose of radiation necessary to cure the resin, but also increases the gel percent of the cured product obtained by curing the resin.

EXAMPLE 4

To 100 parts of the unsaturated polyester resin defined in Example 3 was added 1 part of a different species of amide disclosed below. Each of the mixtures was cured under the conditions specified in Example 1 wherein the total radiation dose was 4 Mrad.

The gel percent of each cured product was determined in a manner similar to that disclosed in Example 1. The results are shown in Table 4.

Table 4

| Amide | none | (a) | (b) | (c) | (d) |
| --- | --- | --- | --- | --- | --- |
| Gel Percent | 73 | 82 | 81 | 83 | 82 |

(a) ε-caprolactam 
(b) oleinamide : $CH_3(CH_2)_7CH=CH(CH_2)_7CONH_2$
(c) n-valeramide : $CH_3(CH_2)_3CONH$
(d) N,N-dimethyl acetamide : $CH_3CON(CH_3)_2$ As shown in Table 4, every amide is useful to improve the curability of the unsaturated polyester resin.

What is claimed is:

1. A process for curing a radiation curable composition consisting essentially of
   (a) from 10.1 to 10 parts by weight of an amide represented by the formula

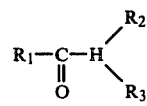

wherein $R_1$ is H, an alkyl group having from 1 to 17 carbon atoms or an alkenyl group having from 1 to 17 carbon atoms and each of $R_2$ and $R_3$ is independently —H, —$CH_3$ or —$CH_2OH$, and $R_1$ and $R_2$ taken together represent alkylene having from 2 to 5 carbon atoms, and
   (b) 100 parts by weight of an unsaturated polyester resin, comprising irradiating the composition with a total dose of less than 10 Mrad of ionizing radiation.

2. The process in accordance with claim 1 wherein the amide is a compound represented by the formula

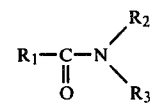

wherein $R_1$ is H, vinyl or methyl, $R_2$ is H and $R_3$ is H, methylol or alkyl having from 1 to 6 carbon atoms.

3. The process in accordance with claim 1 wherein the dose rate of said ionizing radiation ranges from $10^3$ to $10^7$ rad/sec.

4. The process in accordance with claim 1 wherein the amount of said amide ranges from 0.5 to 5.0 parts by weight.

5. The process of claim 1 wherein the total dose of ionizing radiation is from 0.5 Mrad to 10 Mrad.

6. The process of claim 1, wherein the unsaturated polyester resin comprises an unsaturated alkyd dissolved in an ethylenically unsaturated monomer.

7. The process of claim 6, wherein the monomer is styrene.

8. The process of claim 1, wherein the amide is N-methylol acrylamide.

9. The process of claim 1, wherein the amide is acrylamide.

10. The process of claim 1, wherein the amide is acetamide.